(12) United States Patent
Kang et al.

(10) Patent No.: US 10,848,295 B2
(45) Date of Patent: Nov. 24, 2020

(54) MOBILE TERMINAL PERFORMING SYSTEM DAMAGE AVODIANCE IN MULTI-COMMUNICATION SYSTEM

(71) Applicant: LG ELECTRONICS INC., Seoul (KR)

(72) Inventors: Younghee Kang, Seoul (KR); Inkyung Kim, Seoul (KR); Dongsu Won, Seoul (KR); Eunbit Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/281,677

(22) Filed: Feb. 21, 2019

(65) Prior Publication Data

US 2019/0288825 A1 Sep. 19, 2019

Related U.S. Application Data

(60) Provisional application No. 62/645,141, filed on Mar. 19, 2018.

(30) Foreign Application Priority Data

Sep. 12, 2018 (KR) .......................... 10-2018-0109199

(51) Int. Cl.
*H04L 5/14* (2006.01)
*H03F 3/189* (2006.01)

(52) U.S. Cl.
CPC ........... *H04L 5/1461* (2013.01); *H03F 3/189* (2013.01); *H04L 5/1469* (2013.01); *H03F 2200/294* (2013.01)

(58) Field of Classification Search
CPC ....... H04L 5/1461; H04L 5/1469; H04L 7/00; H03F 3/189; H03F 2200/294; H03F 2200/111; H03F 3/24; H03F 3/68; H04B 15/00; H04B 1/0475; H04B 1/525; H04B 1/006; H04B 1/406; H04B 1/005; H04W 52/00; H04W 88/06; H04W 8/26; H04W 92/02; H04M 1/725; H01Q 3/24
See application file for complete search history.

(56) References Cited

U.S. PATENT DOCUMENTS 9,559,791 B2 * 1/2017 Chen ....................... H04B 15/00
9,826,529 B1 * 11/2017 Jorgovanovic ........ H04L 5/1461
(Continued)

FOREIGN PATENT DOCUMENTS

KR 101824006 B1 * 1/2018 ............... H04B 1/50

*Primary Examiner* — Chi H Pham
*Assistant Examiner* — Ji-Hae Yea
(74) *Attorney, Agent, or Firm* — Lee, Hong, Degerman, Kang & Waimey PC

(57) ABSTRACT

A mobile terminal according to the present invention includes a transceiver to operate in a first communication system and a second communication system, a first antenna to transmit or receive a first signal of the first communication system, a second antenna to transmit or receive a second signal of the second communication system, and a signal attenuator module to perform signal attenuation for the first signal on a path between the second antenna and a low noise amplifier (LNA) of the second communication system, whereby system damage in a non-synchronized state between the first and second communication systems can be avoided.

15 Claims, 8 Drawing Sheets

(56) References Cited

U.S. PATENT DOCUMENTS

2010/0210299 A1\* 8/2010 Gorbachov ............. H04M 1/00
455/552
2010/0238075 A1\* 9/2010 Pourseyed ............... H01Q 3/24
343/702
2013/0222056 A1\* 8/2013 Lin ....................... H04B 7/0617
330/124 R \* cited by examiner (a)

(b)

MOBILE TERMINAL PERFORMING SYSTEM DAMAGE AVOIDANCE IN MULTI-COMMUNICATION SYSTEM

CROSS-REFERENCE TO RELATED APPLICATIONS

Pursuant to 35 U.S.C. § 119, this application claims the benefit of earlier filing date and right of priority to U.S. Provisional Patent Application No. 62/645,141, filed on Mar. 19, 2018, and also claims the benefit of Korean Application No. 10-2018-0109199, filed on Sep. 12, 2018, the contents of which are all incorporated by reference herein in their entirety.

BACKGROUND OF THE DISCLOSURE

1. Field of the Disclosure

The present invention relates to a mobile terminal performing system damage avoidance in a multi-communication system, and more particularly, to a mobile terminal for avoiding damage on a receiving end in a multi-communication system.

2. Background Art

Terminals may be divided into mobile/portable terminals and stationary terminals according to mobility. Also, the mobile terminals may be classified into handheld types and vehicle mount types according to whether or not a user can directly carry.

Functions of mobile terminals have been diversified. Examples of such functions include data and voice communications, capturing images and video via a camera, recording audio, playing music files via a speaker system, and displaying images and video on a display unit. Some mobile terminals include additional functionality which supports electronic game playing, while other terminals are configured as multimedia players. Specifically, in recent time, mobile terminals can receive broadcast and multicast signals to allow viewing of video or television programs As it becomes multifunctional, a mobile terminal can be allowed to capture still images or moving images, play music or video files, play games, receive broadcast and the like, so as to be implemented as an integrated multimedia player.

Efforts are ongoing to support and increase the functionality of mobile terminals. Such efforts include software and hardware improvements, as well as changes and improvements in the structural components.

In addition to those attempts, mobile terminals provide various services in recent years by virtue of commercialization of wireless communication systems using a Long Term Evolution (LTE) communication technology, namely, a Fourth Generation (4G) communication technology. In the future, it is expected that a wireless communication system using a Fifth Generation (5G) communication technology will be commercialized to provide various services.

In this regard, it is important to synchronize a base station and a mobile terminal (i., User Equipment (UE)) for transmission and reception through 4G communication and 5G communication or synchronize base stations for transmission through 4G communication and reception through 5G communication. For example, while performing transmission according to 4G communication, the mobile terminal can perform searching for a reception of a specific signal for 5G communication.

If synchronization between networks is appropriately controlled, operations are executed stably in such networks. However, a Tx/Rx period determination may be failed because network synchronization is not appropriately performed on a 5G network. In this case, the following problems occur when physical downlink control channel (PDCCH) paging is performed on the 5G network. That is, the 5G may open an Rx signal path in a power-on state of the Rx and 4G LTE may transmit a Tx signal.

Meanwhile, regarding multiplexing schemes, a frequency division duplex (FDD) divides a Tx frequency band and an Rx frequency band from each other and strongly suppresses the Tx frequency band at Rx input on an Rx signal path. However, in case of a time division duplex (TDD), Rx and Tx frequency band are the same as each other and thereby a Tx signal is directly input through the Rx signal path.

Meanwhile, the mobile terminal uses low noise amplifiers (LNAs) arranged in series for improving reception sensitivity. Due to a gain of a front-end LNA, much severe damage may occur on an input end of a rear-end LNA.

On the other hand, introduction of power from a transmitting end into a receiving end causes a big problem when a 4G communication band and a 5G communication band are the same as each other or adjacent to each other. For example, in the case of LTE re-farming in which the 5G communication band uses the 4G communication band, such a problem occurs to a large extent.

Further, the problem of the introduction of power from the transmitting end into the receiving end is more serious because a 4G communication system or a 4G transceiver cannot control a 5G communication system. In this regard, there is a problem that the 4G communication system or the 4G transceiver cannot control states of individual communication components of the 5G communication system.

SUMMARY OF THE DISCLOSURE

The present invention is directed to solving the aforementioned problems and other drawbacks. Another aspect of the present invention is to provide a mobile terminal capable of avoiding system damage in a non-synchronized state between a first communication system and a second communication system.

Another aspect of the present invention is to provide a mobile terminal capable of preventing reception performance of a second communication system from being lowered due to interference of a transmission signal of a first communication system.

To achieve those aspects and other advantages of the present invention, there is provided a transceiver to operate in a first communication system and a second communication system, a first antenna to transmit or receive a first signal of the first communication system, a second antenna to transmit or receive a second signal of the second communication system, and a signal attenuator module to perform signal attenuation for the first signal on a path between the second antenna and a low noise amplifier (LNA) of the second communication system, whereby system damage can be avoided in a non-synchronized state between the first and second communication systems.

According to one embodiment, the first signal and the second signal may have the same frequency band, and the first communication system and the second communication system may divide a transmission time and a reception time by time division duplex (TDD). Here, the low noise amplifier may be in a power-on state to perform network searching through the second communication system while the first communication system is transmitting the first signal.

According to one embodiment, the signal attenuator module may include a first switch connected to the second antenna and having a first output port and a second output port, an attenuator connected to the second output port of the first switch to attenuate the first signal, and a second switch connected between the attenuator and the low noise amplifier (LNA) and having a first input port and a second input port.

According to one embodiment, the first switch and the second switch may be controlled such that the second input port and the second output port are connected and the first signal may be attenuated through the attenuator when the transceiver transmits a first control signal associated with bypass-on to the signal attenuator module.

According to one embodiment, the first switch and the second switch may be controlled such that the first input port and the first output port are connected and the second signal may be input to the low noise amplifier (LNA) through a path between the first input port and the first output port when the transceiver transmits a second control signal associated with bypass-off to the signal attenuator module.

According to one embodiment, the transceiver may include a first transceiver to operate in the first communication system, and a second transceiver to operate in the second communication system. At this time, the first switch and the second switch may be controlled such that the second input port and the second output port are connected and the first signal is attenuated through the attenuator when the first transceiver transmits a bypass control signal to the signal attenuator module.

According to one embodiment, the first antenna may include first to fourth radiating elements, and the first to fourth radiating elements may be connected to first to fourth low noise amplifiers, respectively. At this time, the first transceiver may transmit a third control signal for controlling the first to fourth low noise amplifiers to be turned on/off to the first to fourth low noise amplifiers.

According to one embodiment, the second antenna may include fifth to eighth radiating elements, and the fifth to eighth radiating elements may be connected to fifth to eighth low noise amplifiers, respectively. At this time, the second transceiver may transmit a fourth control signal for controlling the fifth to eighth low noise amplifiers to be turned on/off to the fifth to eighth low noise amplifiers.

According to one embodiment, the low noise amplifier (LNA) may be configured to perform signal attenuation for the first signal, and include a first path for amplifying the second signal and a second path for attenuating the first signal. At this time, the first signal may be attenuated through the second path when the transceiver transmits a first control signal associated with reception bypass-on to the low noise amplifier (LNA).

According to one embodiment, the signal attenuator module may include a first switch connected to the second antenna and having a first output port and a second output port, and a second switch connected between the first switch and the low noise amplifier (LNA) and having a first input port and a second input port. At this time, the first signal having passed through the second output port may be attenuated through a ground.

According to another aspect of the present invention, there is provided a mobile terminal including, a transceiver to operate in a first communication system and a second communication system, an antenna to transmit or receive a first signal of the first communication system and to transmit or receive a second signal of the second communication system, and a signal attenuator module to perform signal attenuation for the first signal on a path between a low noise amplifier (LNA) of the second communication system and the transceiver.

According to one embodiment, the antenna may include first to fourth radiating elements, and the first radiating element may be connected to a first power amplifier operating in the first communication system and a first low noise amplifier operating in the first communication system and the second communication system. On the other hand, the second radiating element and the third radiating element may be connected to second and third low noise amplifiers operating in the second communication system. The fourth radiating element may be connected to a second power amplifier operating in the second communication system and a fourth low noise amplifier operating in the first communication system and the second communication system.

According to one embodiment, the first signal and the second signal may have the same frequency band, and the first communication system and the second communication system may divide a transmission time and a reception time by time division duplex (TDD). Here, the low noise amplifier may be in a power-on state to perform network searching through the second communication system while the first communication system transmits the first signal.

According to one embodiment, the signal attenuator module may include a first switch connected to the low noise amplifier (LNA) and having a first output port and a second output port, an attenuator coupled to the second output port of the first switch to attenuate the first signal, and a second switch connected between the attenuator and the transceiver and having a first input port and a second input port.

According to one embodiment, the first switch and the second switch may be controlled such that the second input port and the second output portion are connected and the first signal may be attenuated through the attenuator, when the transceiver transmits a first control signal associated with bypass-on to the signal attenuator module.

Effects of the Disclosure

A method for preventing deterioration of reception performance in a multi-communication system and a mobile terminal performing the same according to the present invention may provide the following effects.

In accordance with at least one of the embodiments of the present invention, a mobile terminal that provides transmission signal attenuation on a low noise amplification reception path of a second communication system so as to avoid system damage in a non-synchronized state between a first communication system and the second communication system.

In addition, according to at least one of the embodiments of the present invention, a mobile terminal that prevents deterioration of reception performance of a second communication system due to interference of a transmission signal of a first communication system by providing transmission signal attenuation in a different manner according to whether a transmission/reception division structure is provided.

Further scope of applicability of the present invention will become apparent from the following detailed description. It should be understood, however, that the detailed description and specific examples, such as the preferred embodiment of the invention, are given by way of illustration only, since

DETAILED DESCRIPTION OF THE PREFERRED EMBODIMENTS

Figure 1A:
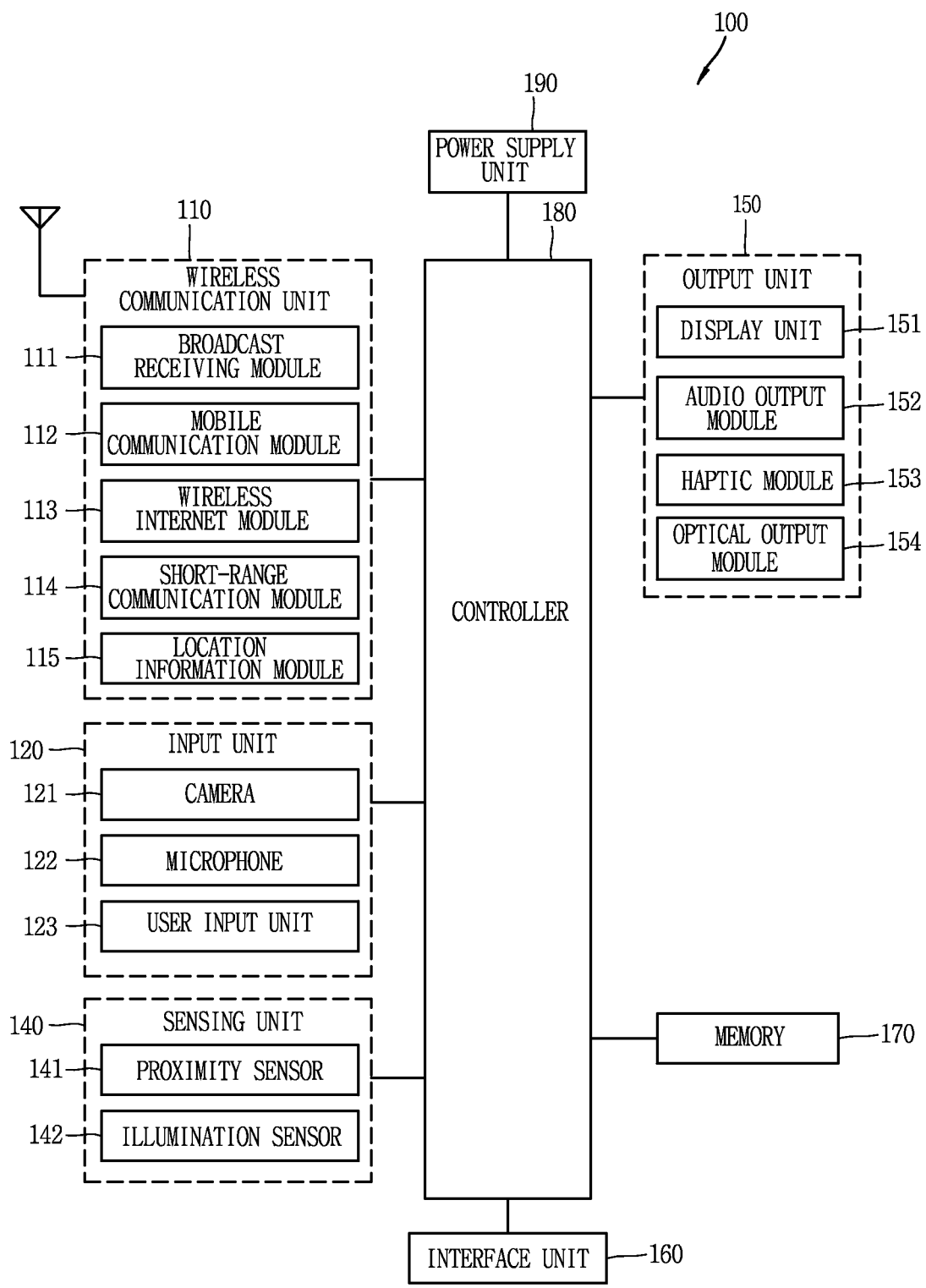
FIG. 1A is a block diagram of a mobile terminal in accordance with one exemplary embodiment of the present invention.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1B:
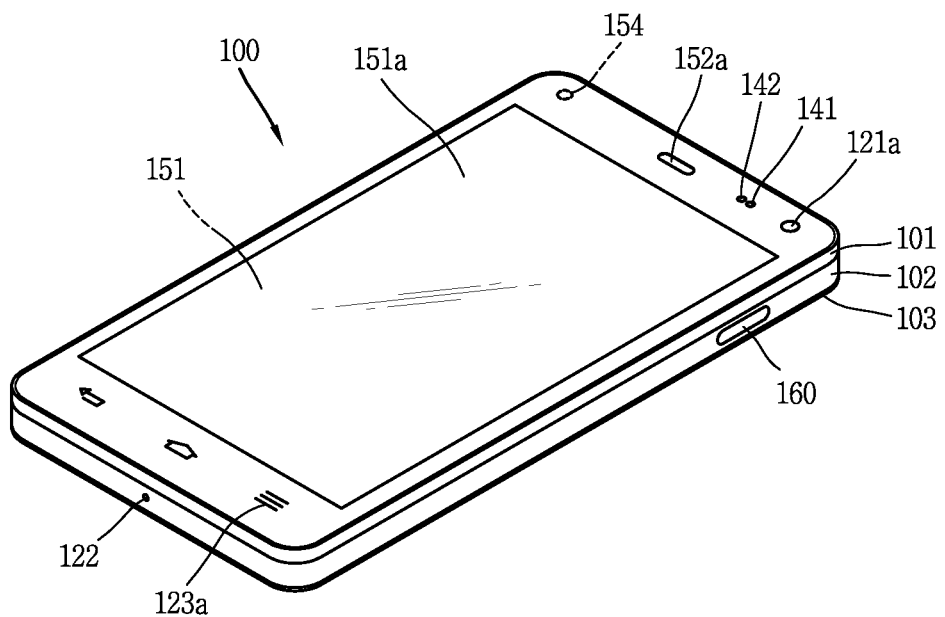
FIGS. 1B and 1C are conceptual views illustrating one example of a mobile terminal according to the present invention, viewed from different directions.
Figure 1C:
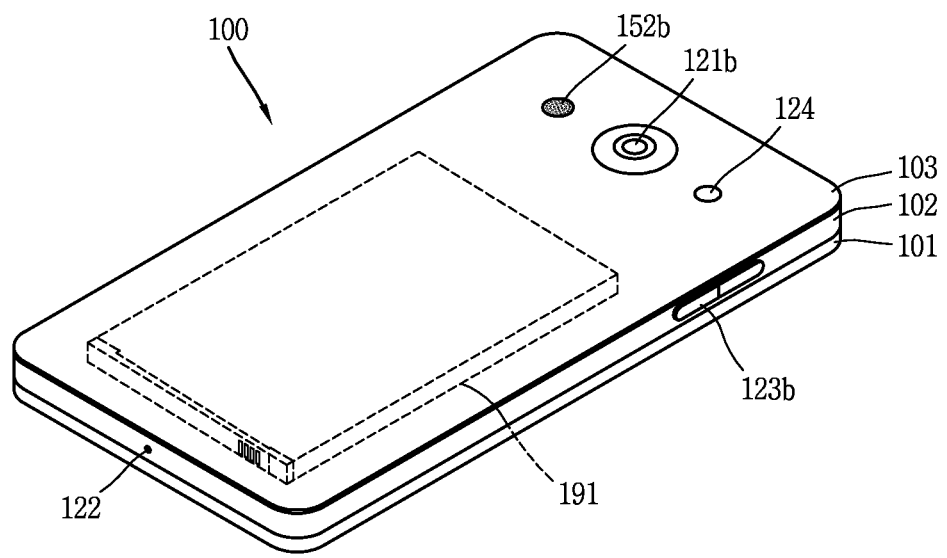

Referring to FIGS. 1A to 1C, FIG. 1A is a block diagram of a mobile terminal in accordance with one exemplary embodiment of the present invention, and FIGS. 1B and 1C are conceptual views illustrating one example of a mobile terminal, viewed from different directions.

The mobile terminal 100 may be shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

In more detail, the wireless communication unit 110 may typically include one or more modules which permit communications such as wireless communications between the mobile terminal 100 and a wireless communication system, communications between the mobile terminal 100 and another mobile terminal, or communications between the mobile terminal 100 and an external server. Further, the wireless communication unit 110 may typically include one or more modules which connect the mobile terminal 100 to one or more networks.

The wireless communication unit 110 may include one or more of a broadcast receiving module 111, a mobile communication module 112, a wireless Internet module 113, a short-range communication module 114, and a location information module 115.

The input unit 120 may include a camera 121 or an image input unit for obtaining images or video, a microphone 122, which is one type of audio input device for inputting an audio signal, and a user input unit 123 (for example, a touch key, a mechanical key, and the like) for allowing a user to input information. Data (for example, audio, video, image, and the like) may be obtained by the input unit 120 and may be analyzed and processed according to user commands The sensing unit 140 may typically be implemented using one or more sensors configured to sense internal information of the mobile terminal, the surrounding environment of the mobile terminal, user information, and the like. For example, the sensing unit 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like). The mobile terminal disclosed herein may be configured to utilize information obtained from one or more sensors of the sensing unit 140, and combinations thereof.

The output unit 150 may typically be configured to output various types of information, such as audio, video, tactile output, and the like. The output unit 150 may be shown having at least one of a display unit 151, an audio output module 152, a haptic module 153, and an optical output module 154. The display unit 151 may have an inter-layered structure or an integrated structure with a touch sensor in order to implement a touch screen. The touch screen may function as the user input unit 123 which provides an input interface between the mobile terminal 100 and the user and simultaneously provide an output interface between the mobile terminal 100 and a user.

The interface unit 160 serves as an interface with various types of external devices that are coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). Application programs may be stored in the memory 170, installed in the mobile terminal 100, and executed by the controller 180 to perform an operation (or function) for the mobile terminal 100.

The modem 180 typically functions to control an overall operation of the mobile terminal 100, in addition to the operations associated with the application programs. The modem 180 may provide or process information or functions appropriate for a user by processing signals, data, information and the like, which are input or output by the aforementioned various components, or activating application programs stored in the memory 170.

Also, the modem 180 may control at least some of the components illustrated in FIG. 1A, to execute an application program that has been stored in the memory 170. In addition, the modem 180 may control at least two of those components included in the mobile terminal 100 to activate the application program.

The power supply unit 190 may be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

At least part of the components may cooperatively operate to implement an operation, a control or a control method of a mobile terminal according to various embodiments disclosed herein. Also, the operation, the control or the control method of the mobile terminal may be implemented on the mobile terminal by an activation of at least one application program stored in the memory 170.

Referring to FIGS. 1B and 1C, the disclosed mobile terminal 100 includes a bar-like terminal body. However, the mobile terminal 100 may alternatively be implemented in any of a variety of different configurations. Examples of such configurations include watch type, clip-type, glasses-type, or a folder-type, flip-type, slide-type, swing-type, and swivel-type in which two and more bodies are combined with each other in a relatively movable manner, and combinations thereof. Discussion herein will often relate to a particular type of mobile terminal. However, such teachings with regard to a particular type of mobile terminal will generally apply to other types of mobile terminals as well.

Here, considering the mobile terminal 100 as at least one assembly, the terminal body may be understood as a conception referring to the assembly.

The mobile terminal 100 will generally include a case (for example, frame, housing, cover, and the like) forming the appearance of the terminal. In this embodiment, the case is formed using a front case 101 and a rear case 102. Various electronic components are interposed into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

The mobile terminal 100 may include a display unit 151, first and second audio output module 152a and 152b, a proximity sensor 141, an illumination sensor 142, an optical output module 154, first and second cameras 121a and 121b, first and second manipulation units 123a and 123b, a microphone 122, an interface unit 160, and the like.

Hereinafter, as illustrated in FIGS. 1B and 1C, description will be given of the exemplary mobile terminal 100 in which the front surface of the terminal body is shown having the display unit 151, the first audio output module 152a, the proximity sensor 141, the illumination sensor 142, the optical output module 154, the first camera 121a, and the first manipulation unit 123a, the side surface of the terminal body is shown having the second manipulation unit 123b, the microphone 122, and the interface unit 160, and the rear surface of the terminal body is shown having the second audio output module 152b and the second camera 121b.

However, those components may not be limited to the arrangement. Some components may be omitted or rearranged or located on different surfaces. For example, the first manipulation unit 123a may not be located on the front surface of the terminal body, and the second audio output module 152b may be located on the side surface of the terminal body other than the rear surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display module 151 may include at least one of a liquid crystal display (LCD), a thin film transistor-LCD (TFT LCD), an organic light-emitting diode (OLED), a flexible display, a three-dimensional (3D) display and an e-ink display.

The display unit 151 may be implemented using two display devices, according to the configuration type thereof. For instance, a plurality of the display units 151 may be arranged on one side, either spaced apart from each other, or these devices may be integrated, or these devices may be arranged on different surfaces.

The display unit 151 may include a touch sensor that senses a touch with respect to the display unit 151 so as to receive a control command in a touch manner. Accordingly, when a touch is applied to the display unit 151, the touch sensor may sense the touch, and a modem 180 may generate a control command corresponding to the touch. Contents input in the touch manner may be characters, numbers, instructions in various modes, or a menu item that can be specified.

The first audio output module 152a may be implemented as a receiver for transmitting a call sound to a user's ear and the second audio output module 152b may be implemented as a loud speaker for outputting various alarm sounds or multimedia playback sounds.

The window 151a of the display unit 151 may include sound holes for emitting sounds generated from the first audio output module 152a. However, the present invention is not limited thereto, and the sounds may be released along an assembly gap between the structural bodies (for example, a gap between the window 151a and the front case 101). In this case, a hole independently formed to output audio sounds may not be seen or may otherwise be hidden in terms of appearance, thereby further simplifying the appearance of the mobile terminal 100.

The optical output module 154 may be configured to output light for indicating an event generation. Examples of such events may include a message reception, a call signal reception, a missed call, an alarm, a schedule alarm, an email reception, information reception through an application, and the like. When a user has checked a generated event, the modem 180 may control the optical output module 154 to stop the light output.

The first camera 121a may process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion. The first and second manipulation units 123a and 123b may employ any method if it is a tactile manner allowing the user to perform manipulation with a tactile feeling such as touch, push, scroll or the like. The first and second manipulation units 123a and 123b may also be manipulated through a proximity touch, a hovering touch, and the like, without a user's tactile feeling.

The drawings are illustrated on the basis that the first manipulation unit 123a is a touch key, but the present invention may not be necessarily limited to this. For example, the first manipulation unit 123a may be configured as a mechanical key, or a combination of a touch key and a push key.

The content received by the first and second manipulation units 123a and 123b may be set in various ways. For example, the first manipulation unit 123a may be used by the user to input a command such as menu, home key, cancel, search, or the like, and the second manipulation unit 123b may be used by the user to input a command, such as controlling a volume level being output from the first or second audio output module 152a or 152b, switching into a touch recognition mode of the display unit 151, or the like.

With regard to the aforementioned wireless communication unit 110, that is, the mobile communication module 112 and the wireless Internet module 113, a system damage avoidance method in a multi-communication system and a mobile terminal 100 performing the same will be described below. Here, a transceiver, a power amplifier (PA), and a low noise amplifier (LNA) within the wireless communication unit 110 in the multi-communication system structure interact with the controller 180 managing all of those components and the power supply unit 190.

Hereinafter, description will be given of embodiments of a system damage avoidance in a multi-communication system and a mobile terminal performing the same with reference to the accompanying drawings. It will be apparent to those skilled in the art that the present invention may be embodied in other specific forms without departing from the spirit or essential characteristics thereof.

Figure 2:
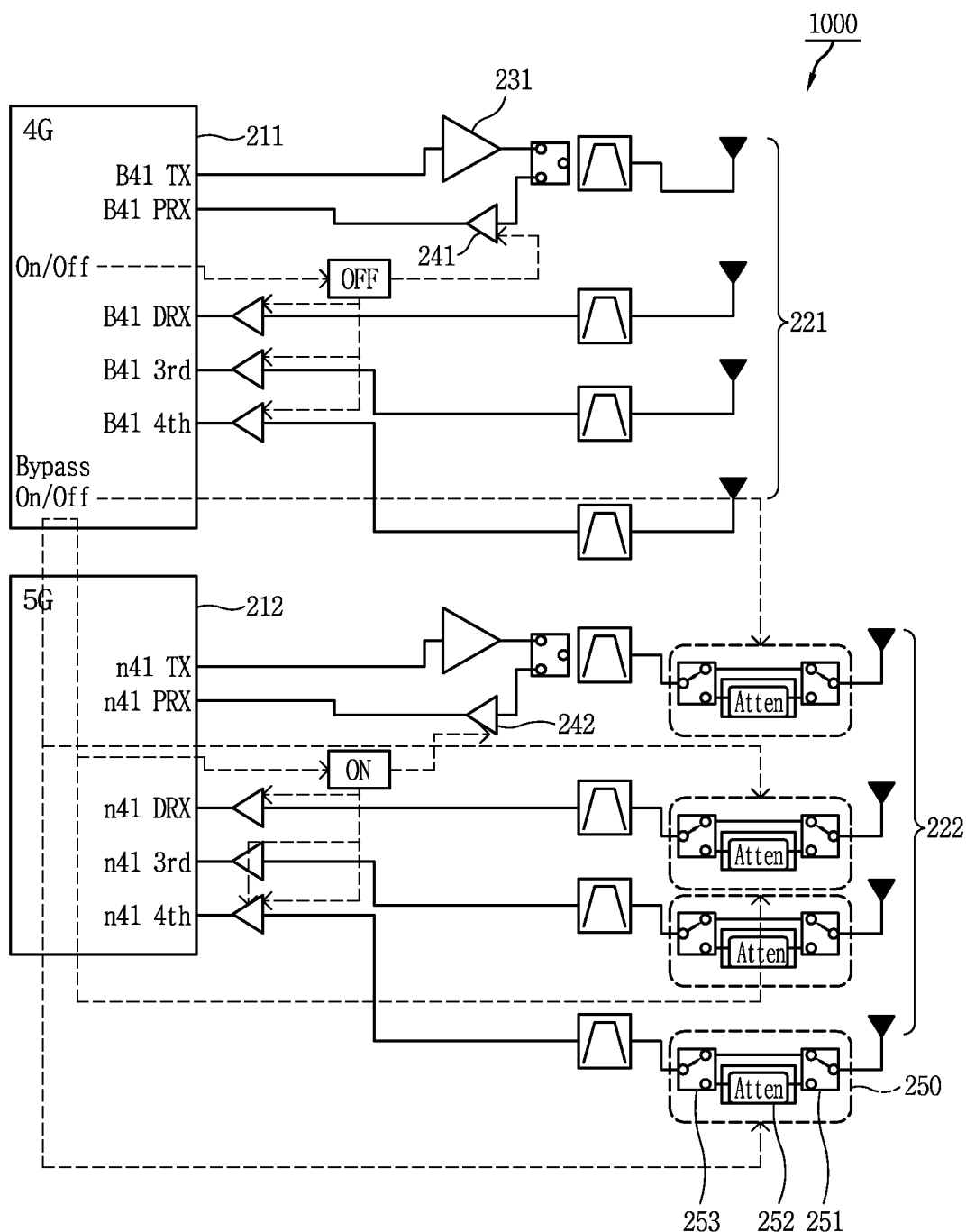
FIG. 2 is a view of a mobile terminal performing system damage avoidance in a multi-communication system according to the present invention.

FIG. 2 is a view of a mobile terminal performing system damage avoidance in a multi-communication system according to the present invention. Referring to FIG. 2, a mobile terminal 1000 includes a first transceiver 211, a second transceiver 212, a first antenna 221, a second antenna 222, a first power amplifier (PA) 231, a second power amplifier 232, first low noise amplifiers (LNA) 241, second low noise amplifiers 242 and a signal attenuator module 250.

Figure 3:
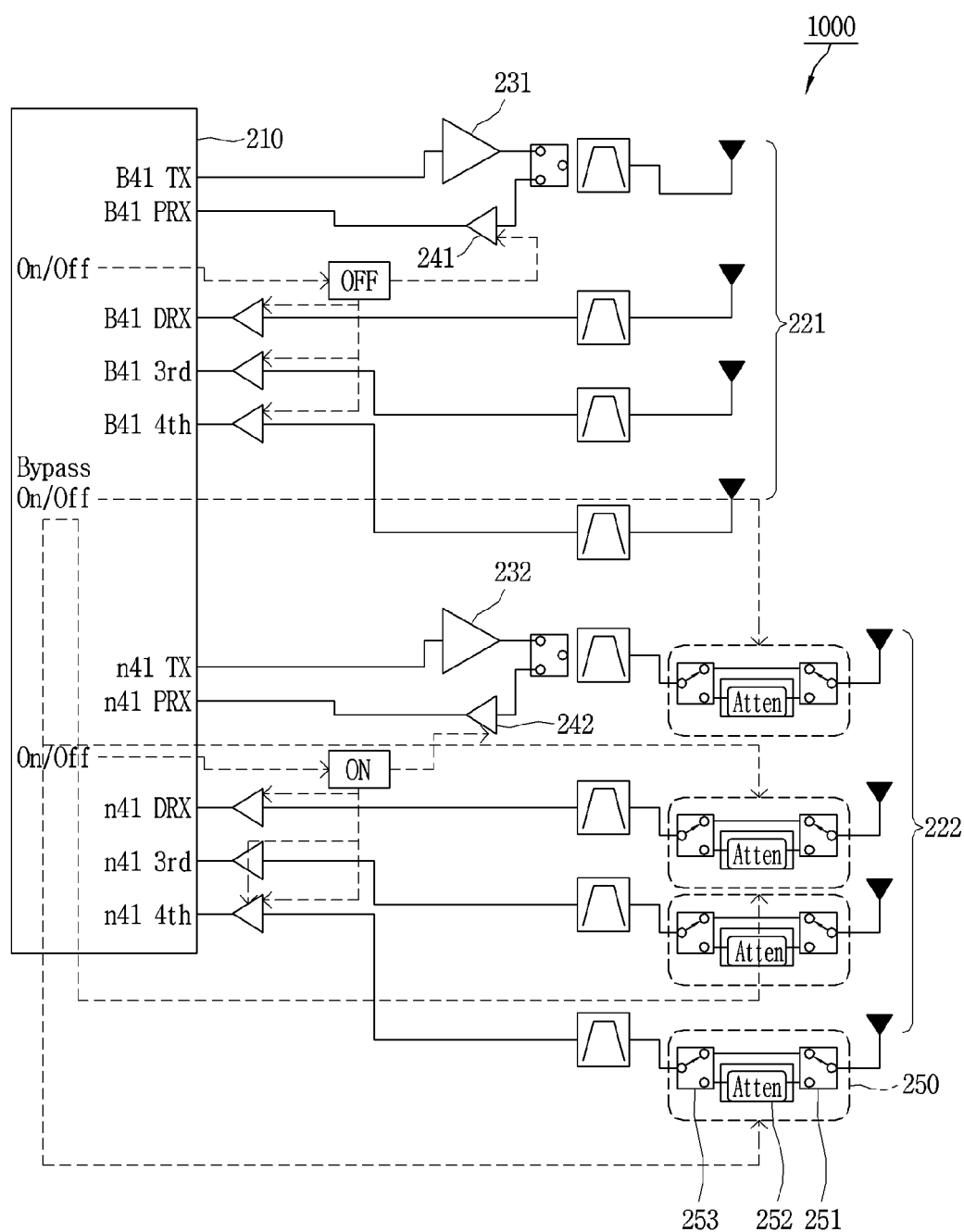
FIG. 3 is a view another embodiment of a mobile terminal performing system damage avoidance in a multi-communication system according to the present invention.

Meanwhile, FIG. 3 is a view another embodiment of a mobile terminal performing system damage avoidance in a multi-communication system according to the present invention. Referring to FIG. 3, the mobile terminal 1000 includes a transceiver 210, a first antenna 221, a second antenna 222, a first power amplifier 231, a second power amplifier 232, first low noise amplifiers 241, second low noise amplifiers 242, and a signal attenuator module 250. Therefore, in FIG. 3, the first transceiver 211 and the second transceiver 212 are replaced with the single transceiver 210, unlike FIG. 2. Here, the single transceiver 210 may be referred to as an integrated transceiver 210. Accordingly, the integrated transceiver 210 may perform control for individual communication components in 4G and 5G communication systems.

On the other hand, in FIG. 3, a Tx output from the first antenna 221 may be input to each of the individual second low noise amplifiers 242 through the second antenna 222. At this time, power input from the first antenna 221 reaches the second low noise amplifiers 242, and some of the second low noise amplifiers 242 exceed an LNA maximum power input. In this regard, if isolation between the first and second antennas 221 and 222 is not good, some of the second low noise amplifiers 242 exceed the LNA maximum power input.

In a first communication system such as a 4G LTE system, since switching between Tx and RX is performed in one system even in the case of TDD, this problem does not occur. However, as illustrated herein, the problem related to the LNA maximum power input occurs in a 4G+5G dual connection structure. On the other hand, in TDD in which Tx and Rx frequency bands are the same, an Rx filter fails to filter a Tx band signal.

On the other hand, in the case of FDD in the first communication system such as the 4G LTE system, an RX system is powered on as a Tx output is introduced into an Rx antenna, but the aforementioned problem does not occur. This is because Tx and Rx in FDD have different frequency bands and a Tx band signal is removed when it passes through the Rx filter.

Referring to FIG. 3, the first transceiver 211 and the second transceiver 212 may be referred to as the single transceiver 210. Meanwhile, one of the first low noise amplifier 241 and the second low noise amplifier 242 may be referred to as a low noise amplifier. The present invention desires to study an affection to a receiving unit of a second communication system in response to a transmission of a first signal of a first communication system. Thus, the low noise amplifier may refer to the second low noise amplifier 242 of the second communication system.

The transceiver 210 is configured to operate in both of the first communication system and the second communication system. On the other hand, the first antenna 221 is configured to transmit or receive a first signal of the first communication system. Also, the second antenna 222 is configured to transmit or receive a second signal of the second communication system. For example, the first communication system and the second communication system may be a 4G communication system and a 5G communication system, respectively.

At this time, in order to support LTE re-farming between 4G communication and 5G communication, the first signal and the second signal may have the same frequency band. On the other hand, in the first communication system and the second communication system, a transmission time and a reception time may be distinguished by time division duplex (TDD). In this regard, while the first communication system is transmitting the first signal, the low noise amplifier 242 may be in a power-on state to perform network searching through the second communication system.

The signal attenuator module 250 may include a first switch 251, an attenuator 252, and a second switch 253. At this time, the first switch 251 may be connected to the second antenna 222, and may have a first output port and a second output port. On the other hand, the attenuator 252 is connected to the second output port of the first switch 251 and is configured to attenuate the first signal. The second switch 253 is connected between the attenuator 252 and the low noise amplifier 242 and may have a first input port and a second input port.

Meanwhile, the signal attenuator module 250 is configured to perform signal attenuation for the first signal on a path between the second antenna 222 and the low noise amplifier 242 of the second communication system.

Hereinafter, a bypass-on/off control in the integrated transceiver 210 or the first transceiver 211 will be described. At this time, an input to the first antenna 221 is the same, but a signal is input to the second low noise amplifier 242 via a bypass. As described above, since a system gain is not set to a large value in a bypass state, there is no problem even if a maximum power input level to the second communication system is high.

In this regard, description will be given of generation and transmission of a bypass-on control signal to reduce an influence on a receiving end of the 5G communication system as a first signal of the 4G communication system is transmitted. When the transceiver 210 transmits a first control signal associated with bypass-on to the signal attenuator module 250, the first switch 251 and the second switch 252 are controlled such that the second input port and the second output port are connected. Accordingly, the first signal of the 4G communication system can be attenuated while passing through the attenuator 252, and damage to the second low noise amplifier 242 caused due to the first signal can be avoided.

Next, a bypass-off control is performed when reception through the 5G communication system is not required or when there is no influence on the receiving end of the 5G communication system due to transmission in the 4G communication system. That is, when there is no influence on the receiving end of the 5G communication system, 5G reception performance can be maximized through the bypass-off control.

In this regard, when the transceiver 210 transmits a second control signal associated with bypass-off to the signal attenuator module 250, the first switch 251 and the second switch 253 are controlled such that the first input port and the first output port are connected. Accordingly, the second signal can be input to the low noise amplifier 242 through a path between the first input port and the first output port. At this time, a reception level of the first signal of the 4G communication system received through the low noise amplifier 242 is much lower than a reception level of the second signal. Therefore, the reception performance of the 5G communication system is not deteriorated due to the first signal of the 4G communication system.

Hereinafter, a transceiver isolation structure according to the present invention will be described with reference to FIG. 2. The description of the same configuration will be replaced with the foregoing description given in FIG. 3.

On the other hand, referring to FIG. 2, the first transceiver 211 is configured to operate in the first communication system. In addition, the second transceiver 212 is configured to operate in the second communication system. At this time, the transmission of the bypass on/off signal may be performed by the first transceiver 211. A detailed control for a communication operation in the second communication system may be performed by the second transceiver 212. For example, operations such as turning on/off the second low noise amplifier 242 and the like may be performed by the second transceiver 212.

Therefore, during transmission to a base station using the first communication system, the first transceiver 211 cannot perform operations such as turning on/off the second low noise amplifier 242 of the second communication system and the like. However, according to the present invention, even during the transmission to the base station using the first communication system, the first transceiver 211 can control the signal attenuator module 250 to avoid damage to the second low noise amplifier 242.

In detail, when the first transceiver 211 transmits a bypass control signal to the signal attenuator module 250, the first switch 251 and the second switch 253 are controlled such that the second input port and the second output port are connected. Accordingly, the first signal of the 4G communication system can be attenuated while passing through the attenuator 252, and damage to the second low noise amplifier 242 caused due to the first signal can be avoided.

This may allow setting of a bypass for suppressing input power to an extent that the second low noise amplifier 242 is not damaged through switching to be the same as the LNA bypass sequence by using the signal attenuator module 250. According to the present invention, this bypass setting can be implemented to be controlled by the first transceiver 211 corresponding to a 4G modem or a 4G transceiver.

The first communication system may perform 4×4 Multi-Input Multi-Output (MIMO) with a first base station through the mobile terminal 1000. On the other hand, the first communication system may perform the 4×4 MIMO with a second base station through the mobile terminal 1000.

In this regard, referring to FIGS. 2 and 3, the first antenna 221 includes first to fourth radiating elements, and the first to fourth radiating elements are connected to first to fourth low noise amplifiers, respectively. Referring to FIG. 2, the first transceiver 211 may transmit a third control signal for controlling the first to fourth low noise amplifiers to be turned on/off to the first to fourth low noise amplifiers.

On the other hand, the second antenna includes fifth to eighth radiating elements, and the fifth to eighth antennas are connected to fifth to eighth low noise amplifiers, respectively. Referring to FIG. 2, the second transceiver 212 may transmit a fourth control signal for controlling the fifth to eighth low noise amplifiers to be turned on/off to the fifth to eighth low noise amplifiers.

Figure 4:
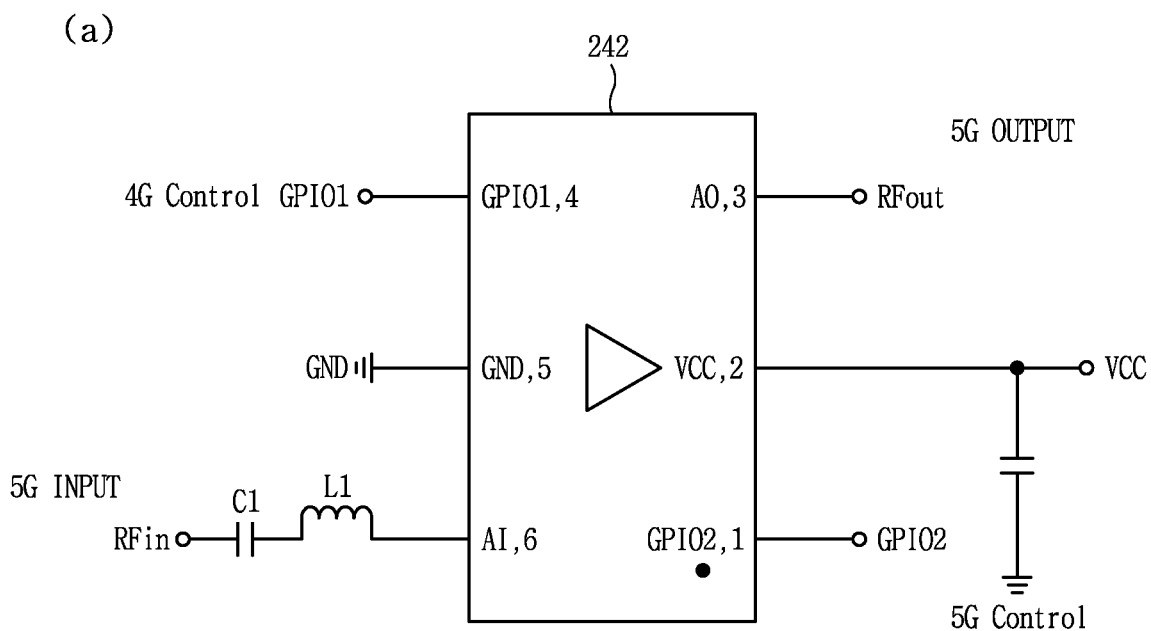
FIG. 4 is a view comparing a low noise amplifier (LNA) bypass mode and a signal attenuator according to the present invention.
Figure 4:
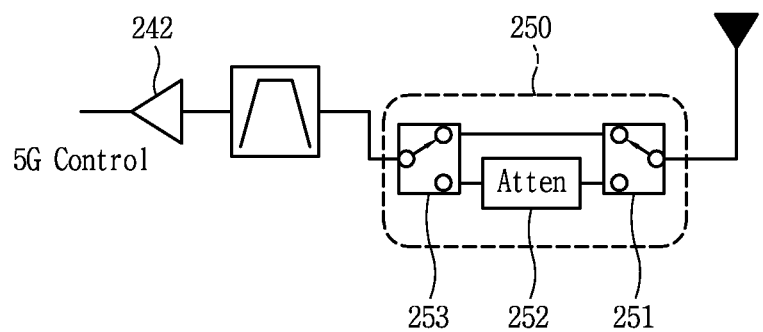

Meanwhile, the LNA may support a bypass mode instead of the signal attenuator module 250 of FIGS. 2 and 3 or by itself together with the signal attenuator module 250. In this regard, FIG. 4 is a view comparing an LNA bypass mode and a signal attenuator according to the present invention.

In this regard, a method of synchronizing switches SW between 5G and 4G in a modem as shown in Table 1 may be implemented.

TABLE 1

| SW Control | B41 RX | B41 TX | n41 RX | n41 TX |
| --- | --- | --- | --- | --- |
| DC @ Rx | on | off | on | off |
| DC @ Tx | off | on | off | on |
| LTE-Rx & NR-Searching | on | off | on | off |
| LTE-Tx & NR-Searching | off | on | off | off |

At this time, there may be a limit in avoiding system damage in all cases caused by unexpected situations of a network when the switches SW are applied. Therefore, the system can be protected from damage by bypassing an LNA in which a problem is likely to occur or switching to an attenuation path. At this time, a corresponding sequence may be implemented to be used in the case of transmission (Tx) of the first communication system, that is, B41 (LTE).

In other words, a control such as system on/off of 5G LNA and 5G receiving end is performed in a 5G modem, but there may be a moment when a 4G output signal is transferred to the system to cause system damage. Therefore, it is necessary to control a method of bypassing a reception signal path from the first communication system corresponding to the 4G system to the second communication system corresponding to the 5G system.

On the other hand, referring to (a) of FIG. 4, the second low noise amplifier 242 may operate in a bypass mode or a high gain mode according to a combination of a low voltage or a high voltage through a control terminal GPI01, GPI02. At this time, the first input port and the first output port for amplifying a 5G reception signal correspond to RFin and RFout.

Referring to (a) of FIG. 4, the low noise amplifier 242 is configured to perform signal attenuation for the first signal. The low noise amplifier 242 includes a first path for amplifying the second signal and a second path for attenuating the first signal. Here, the first path is a path corresponding to the first input port RFin and the first output port RFout, while the second path is a path between the first input port RFin and the ground GND. At this time, the first signal, which is a transmission signal of the first communication system, may be attenuated through the ground.

Referring to (b) of FIG. 4, the second low noise amplifier 242 is connected to the signal attenuator module 250 and a filter. As described above, the first signal, which is the transmission signal of the first communication system, is attenuated through the attenuator 252 and transmitted to the second low noise amplifier 242, thereby preventing damage to the second low noise amplifier 242. On the other hand, the second signal, which is a reception signal of the second communication system, is transmitted through another path other than the attenuator 252, and subjected to a low noise amplification through the second low noise amplifier 242.

Meanwhile, the signal attenuator module 250 may include the first switch 251 and the second switch 253 without the attenuator 252. At this time, the first switch 251 is connected to the second antenna 222, and has a first output port and a second output port. On the other hand, the second switch 253 is connected between the first switch 251 and the low noise amplifier 242, and has a first input port and a second input port. On the other hand, the first signal that has passed through the second output port can be attenuated through the ground.

Figure 5:
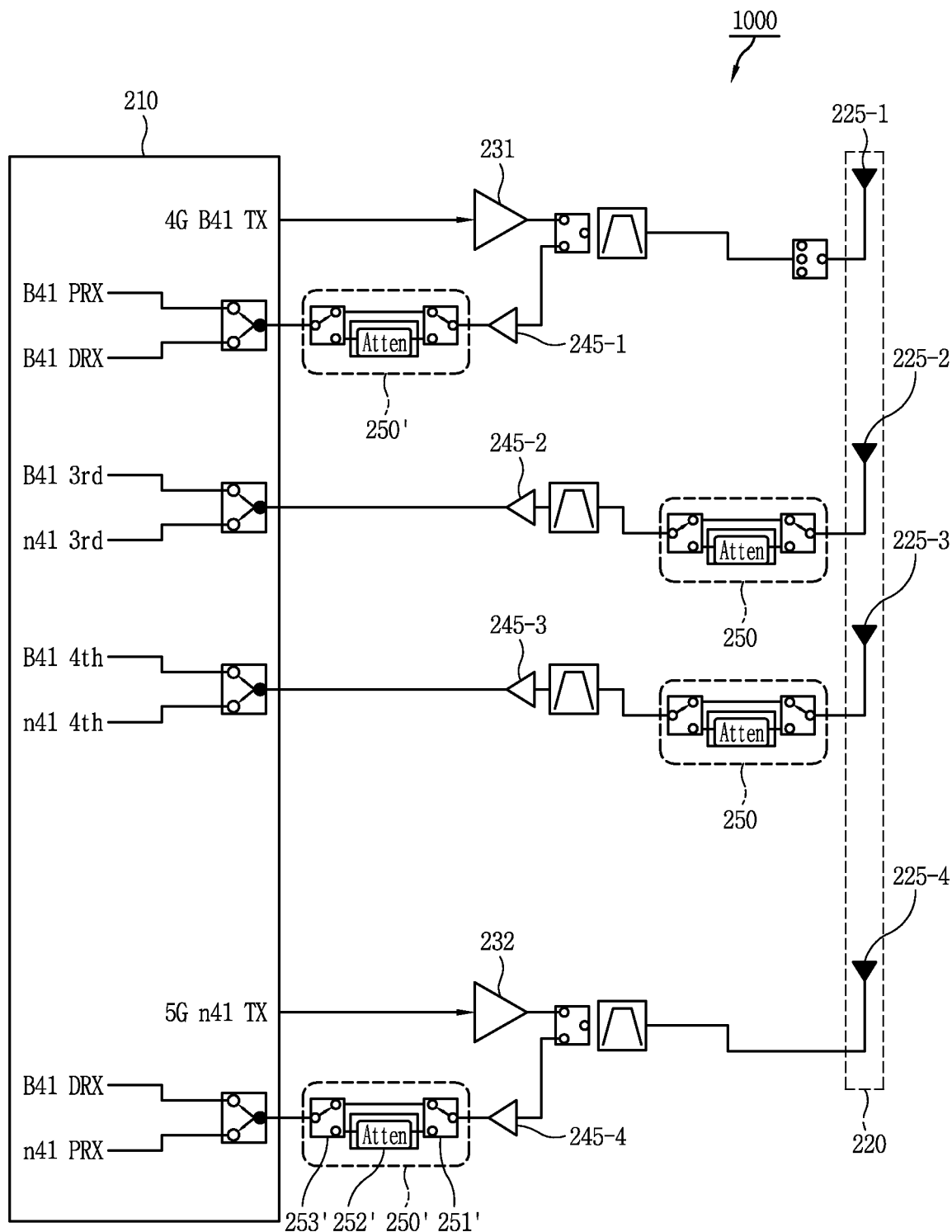
FIG. 5 is a view illustrating a structure of a mobile terminal having a multi-communication system including a common antenna according to one embodiment of the present invention.

Meanwhile, a mobile terminal that performs system damage avoidance in a multi-communication system according to the present invention may be implemented through a common antenna. In this regard, FIG. 5 illustrates a structure of a mobile terminal having a multi-communication system including a common antenna according to one embodiment of the present invention. Referring to FIG. 5, a mobile terminal 1000 includes a transceiver 210, an antenna 220, and signal attenuator modules 250.

At this time, the transceiver 210 is configured to operate in the first communication system and the second communication system. Meanwhile, the transceiver 210, as illustrated in FIG. 2, may include the first transceiver 211 and the second transceiver 212. At this time, the first transceiver 211 is configured to operate in the first communication system, while the second transceiver 212 is configured to operate in the second communication system.

On the other hand, the antenna 220 is configured to transmit or receive the first signal of the first communication system and to transmit or receive the second signal of the second communication system. At this time, the antenna 220 may include a plurality of radiating elements, and some of them may operate as a common antenna.

In one embodiment, a first radiating element 225-1 may operate in a transmission/reception mode. At this time, the first radiating element 225-1 may support a transmission mode of the first communication system. Accordingly, the first radiating element 225-1 may be connected to the first power amplifier 231 operating in the first communication system and a first low noise amplifier 245-1 operating in the first communication system and the second communication system.

On the other hand, a second radiating element 225-2 and a third radiating element 225-3 may operate only in a reception mode. Accordingly, the second radiating element 225-2 and the third radiating element 225-3 may be connected to second and third low noise amplifiers 245-2 and 245-3 both operating in the second communication system.

Meanwhile, a fourth radiating element 225-4 may operate in the transmission/reception mode. At this time, the fourth radiating element 225-4 may support a transmission mode of the second communication system. The fourth radiating element 225-4 is connected to a second power amplifier 232 operating in the second communication system and a fourth low noise amplifier 245-4 operating in the first and second communication systems.

Meanwhile, signal attenuator modules 250' are configured to perform signal attenuation for the first signal on paths between the low noise amplifiers 245-1 and 245-4 and the transceiver 210 of the second communication system. On the other hand, the signal attenuator modules 250 may be configured to perform signal attenuation for the first signal on paths between the antenna 220 and the low noise amplifiers 245-2 and 245-3 of the second communication system.

In this way, when a corresponding antenna channel operates in the transmission/reception mode, the signal attenuator modules 250' may be disposed between the low noise amplifiers 245-1 and 245-4 and the transceiver 210 in order to maintain quality of a transmission signal. On the other hand, when a corresponding antenna channel only operates in the reception mode, the signal attenuator modules 250 may be disposed between the antenna 220 and the low noise amplifiers 245-2 and 245-3.

Figure 6:
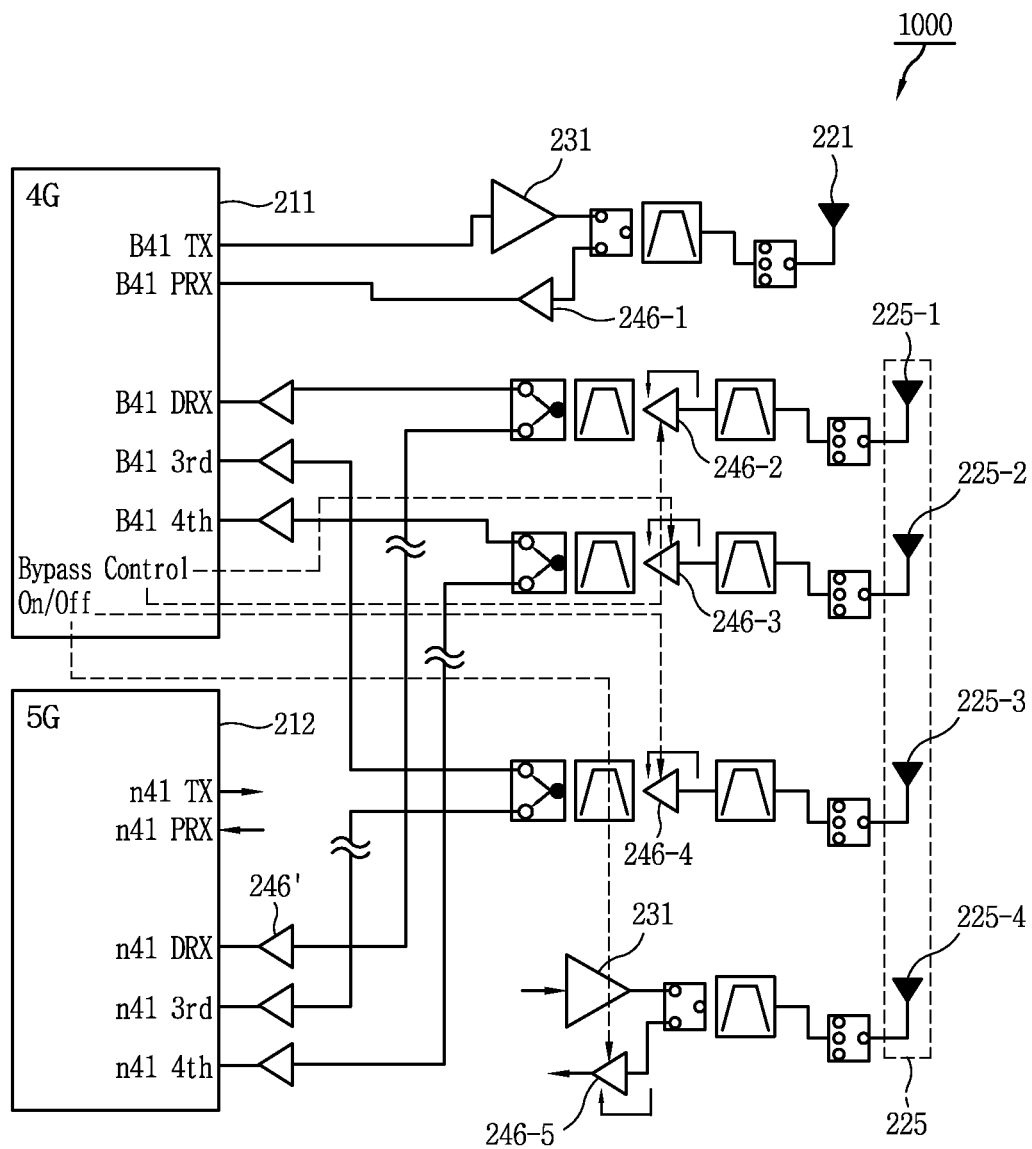
FIG. 6 is a view of a mobile terminal having a multi-communication system including a common antenna according to another embodiment of the present invention.

At this time, the combination of the number of the antennas 220 and the support of the transmission/reception mode or the reception mode may freely vary depending on an application. In this regard, FIG. 6 illustrates a structure of a mobile terminal having a multi-communication system including a common antenna according to another embodiment of the present invention. Referring to FIG. 6, a mobile terminal 1000 includes first and second transceivers 211 and 212, a first antenna 221, an antenna 225, first to fifth low noise amplifiers 246-1 to 246-5. Here, the antenna 225 is configured to operate in a multi-system, i.e., the first and second communication systems. The antenna 225 includes a plurality of radiating elements, which may operate as a common antenna.

Here, the first antenna 221 is configured to transmit or receive the first signal of the first communication system, while the antenna 225 is configured to transmit or receive the first signal of the first communication system and transmit or receive the second signal of the second communication system. At this time, the antenna 225 includes first to fourth radiating elements 225-1 to 225-4.

Referring to FIG. 6, when a receiving end commonly uses an antenna such as a first radiating element 225-1, the second low noise amplifier 246-2, which is a common LNA, may be used. Here, the term "common" means operating in both of the first and second communication systems.

Meanwhile, the second to fifth low noise amplifiers 246-2 to 246-5 are configured to perform low noise amplification for the first signal of the first communication system and the second signal of the second communication system. On the other hand, the second to fifth low noise amplifiers 246-2 to 246-5 may be provided with self-bias circuits, respectively, as illustrated in (a) of FIG. 4, in order to avoid system damage due to the first signal coupled from the first antenna 221 to the antenna 225.

The second to fifth low noise amplifiers 246-2 to 246-5 are configured to perform signal attenuation for the first signal. On the other hand, the second to fifth low noise amplifiers 246-2 to 246-5 have a first path for amplifying the second signal and a second path for attenuating the first signal. At this time, when the first transceiver 211 transmits a first control signal associated with reception bypass-on to the second to fifth low noise amplifiers 246-2 to 246-5, the first signal is attenuated through the second path. Alternatively, the first signal introduced into the second to fifth low noise amplifiers 246-2 to 246-5 may be attenuated through the ground.

Further, a situation in which damage occurs in rear end LNAs connected to rear ends of the second to fifth low noise amplifiers 246-2 to 246-5 is as follows. In the first communication system corresponding to 4G, a Tx output is increased to a high power level via the first power amplifier 231 and radiated through the first antenna 221. At this time, the radiated Tx output may be coupled to the first radiating element 225-1 adjacent to the first antenna 221. Power input to the first radiating element 225-1 is amplified through the second low noise amplifier 246-2. The amplified signal is introduced into a rear end LNA 246' connected to the second low noise amplifier 246-2. On the other hand, a power value introduced into the rear end LNA 246' may be a value that exceeds an input limit power.

On the other hand, the antenna 220 is configured to transmit or receive the first signal of the first communication system and to transmit or receive the second signal of the second communication system. At this time, the antenna 220 may include a plurality of radiating elements, which may operate as a common antenna.

In one embodiment, the first to fourth radiating elements 225-1 to 225-4 may operate in a reception mode or a transmission/reception mode. At this time, the first to third radiating elements 225-1 to 225-3 may support the reception mode of the first and second communication systems. The first to third radiating elements 225-1 to 225-3 may be connected to the second to fourth low noise amplifiers 246-2 to 246-4. Meanwhile, the second to fifth low noise amplifiers 246-2 to 246-4 are configured to perform low noise amplification for the first signal of the first communication system and the second signal of the second communication system.

Meanwhile, the fourth radiating element 225-4 may operate in the transmission/reception mode of the second communication system. At this time, the fourth radiating element 225-4 may be connected to the fifth low noise amplifier 246-5. Here, the fifth low noise amplifier 246-5 is configured to perform low noise amplification for the second signal of the second communication system.

Accordingly, the input to the first antenna 221 is the same as the other case, but intensity of an input signal is not amplified in the second low noise amplifier 246-2 and a loss due to the bypass mode occurs. Further, the intensity of the input signal is further reduced due to an insertion loss in the filter. On the other hand, a signal level introduced into the rear end LNA 246' may be stably maintained below a maximum power input level.

The second to fourth low noise amplifiers 246-2 to 246-4, which are the "common" LNA can all operate in the 5G or 4G communication system, but a bypass control is performed by the first transceiver 211, which is a 4G transceiver.

Figure 7:
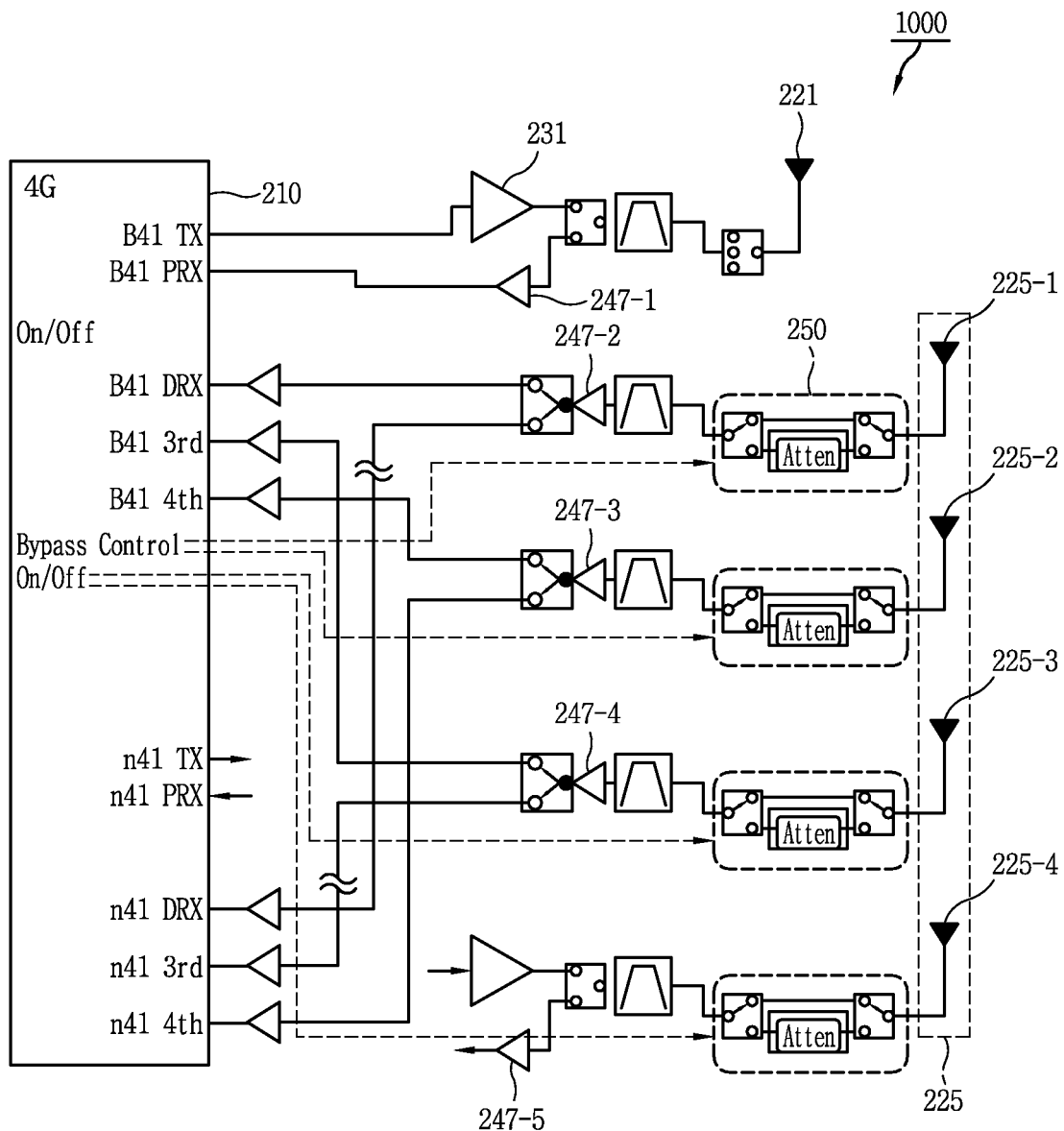
FIG. 7 is a view illustrating a structure of a mobile terminal having a multi-communication system including a common antenna according to still another embodiment of the present invention.

According to another embodiment of the present invention, a signal attenuator may be used in a structure of a mobile terminal having a multi-communication system including a common antenna. In this regard, FIG. 7 illustrates a structure of a mobile terminal having a multi-communication system including a common antenna according to another embodiment of the present invention. Referring to FIG. 7, the mobile terminal 1000 includes a transceiver 210, a first antenna 221, an antenna 225, and first to fifth low noise amplifiers 247-1 to 247-5. Here, the antenna 225 is configured to operate in a multi-system, i.e., the first and second communication systems. The antenna 225 includes a plurality of radiating elements, which may operate as a common antenna.

Here, the first antenna 221 is configured to transmit or receive the first signal of the first communication system, while the antenna 225 is configured to transmit or receive the first signal of the first communication system and transmit or receive the second signal of the second communication system.

In one embodiment, the first to fourth radiating elements 225-1 to 225-4 may operate in a reception mode or a transmission/reception mode. At this time, the first to third radiating elements 225-1 to 225-3 may support the reception modes of the first and second communication systems. The first to third radiating elements 225-1 to 225-3 may be connected to the second to fourth low noise amplifiers 247-2 to 247-4. Meanwhile, the second to fourth low noise amplifiers 247-2 to 247-4 are configured to perform low noise amplification for the first signal of the first communication system and the second signal of the second communication system.

Meanwhile, the fourth radiating element 225-4 may operate in the transmission/reception mode of the second communication system. At this time, the fourth radiating element 225-4 may be connected to the fifth low noise amplifier 247-5. Here, the fifth low noise amplifier 247-5 is configured to perform low noise amplification for the second signal of the second communication system.

Meanwhile, the second to fifth low noise amplifiers 247-2 to 247-5 are configured to perform low noise amplification for the first signal of the first communication system and the second signal of the second communication system. Meanwhile, in order to avoid system damage due to the first signal coupled from the first antenna 221 to the antenna 225, the second to fifth low noise amplifiers 247-2 to 247-5 are provided with the signal attenuator 250 as shown in (b) of FIG. 4.

On the other hand, the signal attenuator module 250 may be configured to perform signal attenuation for the first signal on paths between the antenna 220 and the second to fifth low noise amplifiers 247-2 to 247-5.

On the other hand, the signal attenuator module 250 connected to the fourth radiating element 225-4 may be configured to perform signal attenuation for the first signal on paths between the low noise amplifiers 245-1 and 245-4 of the second communication system and the transceiver 210, as illustrated in FIG. 6. However, in order to prevent damage to the receiving end of the second communication system, the signal attenuator module 250 may be configured to perform signal attenuation for the first signal on paths between the antenna 220 and the second to fifth low noise amplifiers 247-2 to 247-5, as illustrated in FIG. 7.

On the other hand, in the multi-communication system shown in FIGS. 5 to 7, a frequency band of the first signal of the first communication system and a frequency band of the second signal of the second communication system may be the same. This may result in allowing LTE re-farming using the second communication system that provides a 5G communication service.

On the other hand, in the first communication system and the second communication system of the multi-communication system in FIGS. 5 to 7, a transmission time and a reception time may be distinguished by time division duplex (TDD). At this time, the low noise amplifier may be in a power-on state to perform network searching through the second communication system while the first communication system transmits the first signal.

Meanwhile, the signal attenuator module 250' may be provided with a first switch 251', an attenuator 252', and a second switch 253'. At this time, the first switch 251' is connected to the low noise amplifiers 245-2 and 245-3 and has a first output port and a second output port. Meanwhile, the attenuator 252' is connected to the first switch 251' and the second output port and attenuates the first signal. The second switch 253' is connected between the attenuator 252' and the transceiver 210 and has a first input port and a second input port.

Meanwhile, when the transceiver 210 transmits a first control signal associated with bypass-on to the signal attenuator modules 250, 250', the first switch 251, 251' and the second switch 253, 253' are controlled such that the second input port and the second output port are connected and the first signal may be attenuated while passing through the attenuator 252'.

The foregoing description has been given of the method for avoiding damage to the receiving end of the second communication system due to the transmission signal of the first communication system in the various multi-communication system structures according to the present invention and the mobile terminal performing the method.

A method for preventing deterioration of reception performance in a multi-communication system and a mobile terminal performing the same according to the present invention may provide the following effects.

In accordance with at least one of the embodiments of the present invention, a mobile terminal that provides transmission signal attenuation on a low noise amplification reception path of a second communication system so as to avoid system damage in a non-synchronized state between a first communication system and the second communication system.

In addition, according to at least one of the embodiments of the present invention, a mobile terminal that prevents deterioration of reception performance of a second communication system due to interference of a transmission signal of a first communication system by providing transmission signal attenuation in a different manner according to whether a transmission/reception division structure is provided.

Further scope of applicability of the present invention will become apparent from the following detailed description. It should be understood, however, that the detailed description and specific examples, such as the preferred embodiment of the invention, are given by way of illustration only, since various changes and modifications within the spirit and scope of the invention will be apparent to those skilled in the art.

With respect to the above-described present invention, it is possible to implement a design for avoiding deterioration of reception performance between different communication systems and system and an operation of such avoidance as computer-readable codes on a medium on which the program is recorded. The computer-readable medium may include all types of recording devices each storing data readable by a computer system. Examples of such computer-readable media may include hard disk drive (HDD), solid state disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). The computer may include the controller 180 of the terminal. Therefore, it should also be understood that the above-described embodiments are not limited by any of the details of the foregoing description, unless otherwise specified, but rather should be construed broadly within its scope as defined in the appended claims, Therefore, all changes and modifications that fall within the metes and bounds of the claims, or equivalents of such metes and bounds are therefore intended to be embraced by the appended claims.

What is claimed is:

1. A mobile terminal, comprising:
a transceiver configured to operate in a first communication system and a second communication system;
a first antenna configured to transmit or receive a first signal of the first communication system;
a second antenna configured to transmit or receive a second signal of the second communication system; and
a signal attenuator module configured to receive a first control signal associated with reception bypass-on for a low noise amplifier (LNA) of the second communication system and perform signal attenuation for the first signal in a dual connection state of the mobile terminal,
wherein the signal attenuator module includes a switch operably coupled to the second antenna and configured to change paths between the second antenna and the LNA,
wherein the switch is controlled to change the paths when the signal attenuator module receives the first control signal.

2. The terminal of claim 1, wherein:
the first signal and the second signal have the same frequency band;
the first communication system and the second communication system divide a transmission time and a reception time by time division duplex (TDD); and
the LNA is in a power-on state to perform network searching through the second communication system while the first communication system is transmitting the first signal.

3. The terminal of claim 1, wherein the signal attenuator module comprises:
a first switch connected to the second antenna and comprising a first output port and a second output port;
an attenuator operably coupled to the second output port of the first switch and configured to attenuate the first signal; and
a second switch operably coupled between the attenuator and the LNA and comprising a first input port and a second input port.

4. The terminal of claim 3, wherein the first switch and the second switch are controlled such that the second input port and the second output port are operably coupled and the first signal is attenuated through the attenuator when the transceiver transmits a first control signal associated with bypass-on to the signal attenuator module.

5. The terminal of claim 3, wherein the first switch and the second switch are controlled such that the first input port and the first output port are operably coupled and the second signal is input to the LNA through a path between the first input port and the first output port when the transceiver transmits a second control signal associated with bypass-off to the signal attenuator module.

6. The terminal of claim 3, wherein the transceiver comprises:
a first transceiver configured to operate in the first communication system; and
a second transceiver configured to operate in the second communication system, and
wherein the first switch and the second switch are controlled such that the second input port and the second output port are operably coupled and the first signal is attenuated through the attenuator when the first transceiver transmits a bypass control signal to the signal attenuator module.

7. The terminal of claim 1, wherein the transceiver comprises:
a first transceiver configured to operate in the first communication system; and
a second transceiver configured to operate in the second communication system,
wherein the first antenna comprises first, second, third, and fourth radiating elements operably coupled to first, second, third, and fourth low noise amplifiers, respectively, and
wherein the first transceiver is configured to transmit a third control signal for turning on or off the first, second, third, and fourth low noise amplifiers.

8. The terminal of claim 7, wherein the second antenna comprises fifth, sixth, seventh, and eighth radiating elements operably coupled to fifth, sixth, seventh, and eighth low noise amplifiers, respectively, and
wherein the second transceiver is configured to transmit a fourth control signal for turning on or off the fifth, sixth, seventh, and eighth low noise amplifiers.

9. The terminal of claim 1, wherein the first communication system is a 4G communication system and the second communication system is a 5G communication system, and
wherein the switch is controlled to change the paths when the signal attenuator module receives the first control signal in a dual connection structure in which both the 4G communication system and the 5G communication system are connected.

10. The terminal of claim 1, wherein the signal attenuator module comprises:
a first switch operably coupled to the second antenna and comprising a first output port and a second output port; and
a second switch operably coupled between the first switch and the LNA and comprising a first input port and a second input port,
wherein the first signal passes through the second output port and is attenuated through a ground.

11. A mobile terminal, comprising:
a transceiver configured to operate in a first communication system and a second communication system;
an antenna configured to transmit or receive a first signal of the first communication system and to transmit or receive a second signal of the second communication system; and
a signal attenuator module configured to receive a first control signal associated with reception bypass-on for a low noise amplifier (LNA) of the second communication system and perform signal attenuation for the first signal in a dual connection state of the mobile terminal,
wherein the signal attenuator module includes a switch operably coupled to the antenna and configured to change paths between the antenna and the LNA, and
wherein the switch is controlled to change the paths when the signal attenuator module receives the first control signal.

12. The terminal of claim 11, wherein the antenna comprises first, second, third, and fourth radiating elements,
wherein the first radiating element is operably coupled to a first power amplifier configured to operate in the first communication system and a first low noise amplifier configured to operate in the first communication system and the second communication system, wherein the second radiating element and the third radiating element are respectively operably coupled to second and third low noise amplifiers operating in the second communication system, and wherein the fourth radiating element is operably coupled to a second power amplifier configured to operate in the second communication system and a fourth low noise amplifier configured to operate in the first communication system and the second communication system.

13. The terminal of claim 11, wherein:

the first signal and the second signal have the same frequency band;

the first communication system and the second communication system divide a transmission time and a reception time by time division duplex (TDD); and the LNA is configured to be in a power-on state to perform network searching through the second communication system while the first communication system is transmitting the first signal.

14. The terminal of claim 11, wherein the signal attenuator module comprises:

a first switch operably coupled to the LNA and comprising a first output port and a second output port;

an attenuator operably coupled to the second output port of the first switch and configured to attenuate the first signal; and a second switch operably coupled between the attenuator and the transceiver and comprising a first input port and a second input port.

15. The terminal of claim 14, wherein the first switch and the second switch are controlled such that the second input port and the second output portion are operably coupled and the first signal is attenuated through the attenuator when the transceiver transmits a first control signal associated with bypass-on to the signal attenuator module.

\* \* \* \* \*